United States Patent [19]

Karp et al.

[11] 4,233,675
[45] Nov. 11, 1980

[54] X SENSE AMP MEMORY

[75] Inventors: Joel A. Karp, Palo Alto; Ilbok Lee, Sunnyvale; John A. Reed, Los Altos, all of Calif.

[73] Assignee: National Semiconductor Corporation, Santa Clara, Calif.

[21] Appl. No.: 46,509

[22] Filed: Jun. 8, 1979

Related U.S. Application Data

[63] Continuation of Ser. No. 919,993, Jun. 28, 1978, abandoned.

[51] Int. Cl.³ ........................... G11C 7/00; G11C 7/06
[52] U.S. Cl. .............................. 365/205; 307/DIG. 3; 365/149
[58] Field of Search ....................... 365/149, 205, 207; 307/DIG. 3

[56] References Cited

U.S. PATENT DOCUMENTS

| | | | |
|---|---|---|---|
| 3,838,295 | 9/1974 | Lindell | 365/205 |
| 4,003,034 | 1/1977 | Au | 365/149 |
| 4,050,061 | 9/1977 | Kitagawa | 365/205 |

OTHER PUBLICATIONS

Lee et al., Bit-Line Latch Gating Circuit for Field-Effect Trans. Memory, IBM Tech. Disc. Bul., vol. 17, No. 5, 10/74, pp. 1370-1371.
Lee, Cross-Coupled Latch for Memory Sensing, IBM Tech. Disc. Bul., vol. 17, No. 5, 10/74, pp. 1361-1362.

Primary Examiner—Stuart N. Hecker
Attorney, Agent, or Firm—Brown & Martin

[57] ABSTRACT

A semiconductor memory is comprised of a semiconductor substrate having first and second spaced apart arrays of memory cells disposed thereon. A plurality of first pairs of bit lines couple to the cells of the first array, and a corresponding plurality of second pairs of bit lines couple to the cells of the second array. Disposed between each first pair and corresponding second pair of bit lines is one X sense amplifier. This amplifier includes a set node selectively coupled to one bit line of the first pair and to one bit line of the second pair, and a reset node selectively coupled to the opposite bit lines of the first and second pair for selectively sensing charge on the four bit lines.

7 Claims, 7 Drawing Figures

X SENSE AMP MEMORY

This is a continuation of application Ser. No. 919,993 filed June 28, 1978, now abandoned.

BACKGROUND OF THE INVENTION

The disclosed invention relates to semiconductor memories and more particularly to the architecture of such memories. Basically, all semiconductor memories include storage cells and sense amplifiers. Storage cells are utilized to store charge which is representative of digital information. Thousands of these cells are fabricated on a single semiconductor chip. Sense amplifiers are utilized to selectively sense and amplify the charge in the cells to binary voltage levels.

Typically, the thousands of cells within the memory are fabricated in rectangular arrays. Word lines run through the array in one direction and operate to select columns of the cells. Bit lines run through the array perpendicular to the word lines and operate to receive charge from the selected column of cells and transport it to the sense amplifiers for amplification.

Over the past several years, the tendency has been to package as many of the cells into the array as possible. In general, this is accomplished by decreasing the size of each individual cell. As a result, however, the charge storage capacitor of each individual cell is decreased in size. This in turn reduces the amount of charge which can be stored in each cell and makes charge sensing difficult.

Further, each of the bit lines which connect to the cells also has an inherent capacitance. In modern high density memories, this bit line capacitance is substantially greater than the capacitance of each of the cells within the memory. Thus, as the ratio of storage cell capacitance to bit line capacitance decreases, the task of sensing the charge within the selected cells becomes even more difficult. Accordingly, it is desirable to have an architecture for a semiconductor memory which simultaneously provides for a small storage cell and a large storage cell capacitance to bit line capacitance ratio.

In the prior art, each bit line in the memory array has one sense amplifier connected thereto. Accordingly, as the size of each of the cells is decreased (in order to package more cells into the array), the size of the sense amplifier must also necessarily decrease (in order to maintain a symmetrical physical layout). Eventually, however, a point is reached where the size of the sense amplifier can no longer be decreased or it will not be able to detect charge in the cells. At this point, the minimal size of the sense amplifier prevents the size of the memory cells from being further reduced. It is therefore desirable to provide a memory architecture where the sense amplifier size does not limit the cell size within the array.

Also in the prior art, the memories included two arrays of cells with a bit line decoder alongside each array. These decoders operated in conjunction with the bit lines of the respective arrays to write information into the cells. In particular, during a write operation, the bit lines connected to one decoder acted as set leads, while the bit lines connected to the other decoder acted as reset leads. Although much of the two sets of decoding logic was redundant, they were both required since the set leads and reset leads were not available on any side of one array. Accordingly, it is desirable to provide a memory having bit lines which operate as set and reset leads during a write operation which are available on a single side of one array.

It is therefore one object of the invention to provide a semiconductor memory having an improved architecture.

Another object of the invention is to provide a memory having an improved storage capacitance to bit line capacitance ratio.

Another object of the invention is to provide a memory having storage cells which are not limited in size by the minimal dimensions of the sense amplifiers connected thereto.

Another object of the invention is to provide a memory having bit lines which operate as set and reset leads during a write cycle which are available on a single side of the array.

Still another object of the invention is to provide a memory having sense amplifiers for selectively sensing charge on four bit lines.

SUMMARY OF THE INVENTION

These and other objects are accomplished in accordance with the invention by a semiconductor memory having first and second spaced apart arrays of memory cells disposed on a semiconductor substrate. A plurality of first pairs of bit lines couple to the cells within the first array and a corresponding plurality of second pairs of bit lines couple to the cells within the second array. A sensing circuit is disposed between each first pair and corresponding second pair of bit lines. The sensing circuit includes a pair of cross coupled transistors to form a flip-flop having a set node and a reset node. The set node connects through one gating transistor to one bit line of the first pair and through a second gating transistor to one bit line of the second pair. Similarly, the reset node connects through respective gating transistors to the opposite bit line of the first and second pair. In one embodiment, each of the memory cells which connect to the first pair of bit lines has separate word lines; and each of the memory cells connected to the second pair of bit lines also has separate word lines. In a second embodiment, the memory cells coupled to the first pair of bit lines connect in pairs to separate word lines, and the memory cells coupled to the second pair of bit lines also connect in pairs to separate word lines.

DESCRIPTION OF THE DRAWINGS

The novel features believed characteristic of the invention are set forth in the appended claims; the invention itself, however, as well as other features and advantages thereof, will best be understood by reference to the following detailed description of particular embodiments read in conjunction with the accompanying drawings, wherein:

DETAILED DESCRIPTION

Figure 1:
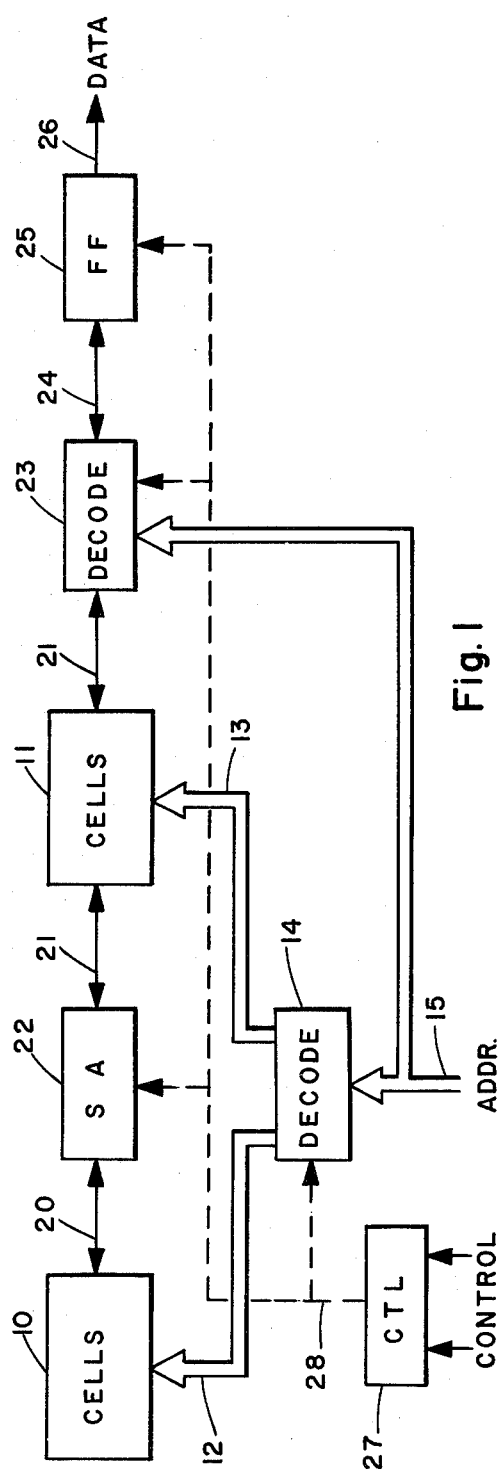
FIG. 1 is a block diagram of a semiconductor memory constructed according to the invention.

Referring now to FIG. 1, there is illustrated a block diagram of a memory which is constructed according to the invention. Included within this memory is a first array of memory cells 10 and a spaced apart second array of memory cells 11. Individual cells within arrays 10 and 11 are selected by signals on word lines 12 and 13 respectively. These word line signals are generated by a decoder 14. Decoder 14 has inputs coupled to an address bus 15. In operation, decoder 14 decodes binary address signals which are applied to bus 15 by an external source not shown. The decoded signals are applied by decoder 14 to one of the word lines 12 or 13 to select one column of the cells that are connected thereto.

The cells within arrays 10 and 11 are interconnected by a plurality of bit line pairs 20 and 21. Specifically, bit line pairs 20 intercouple cells within array 10, while bit line pairs 21 intercouple cells within array 11. Each bit line receives charge from the cells to which it is connected under control of the select signal on word lines 12 and 13.

A plurality of sense amplifiers 22 are disposed between bit line pairs 20 and 21. Basically, these sense amplifiers 22 operate to detect the charge from the bit line pairs. This detection involves the amplifying of signals on the bit lines which are generated by the charge in the selected cells into full logic levels. The detailed manner in which this is done will be described shortly in conjunction with FIGS. 2 and 3.

Bit line pairs 21 extend through array 11 to a decoder 23. Decoder 23 has inputs coupled to bus 15 for receiving address signals therefrom. In operation, the address signals select one of the pairs of bit lines 21. In a read operation, signals on the selected pair of bit lines transfer to a lead 24. Conversely, in a write operation, signals on lead 24 transfer to the selected bit line pair 21.

Signals on lead 24 are loaded into or received from a flip-flop 25. Leads 26 provide a means for loading data into flip-flop 25 and receiving data from flip-flop 25 via an external circuit not shown. Timing signals which synchronize the data transfer between arrays 10 and 11 and flip-flop 25 are provided by control circuitry 27. This circuitry receives control signals from an external source and in response thereto generates the timing signals on leads 28. These signals synchronize the operation of decoders 14 and 23, sense amplifier 22, and flip-flop 25.

Figure 2:
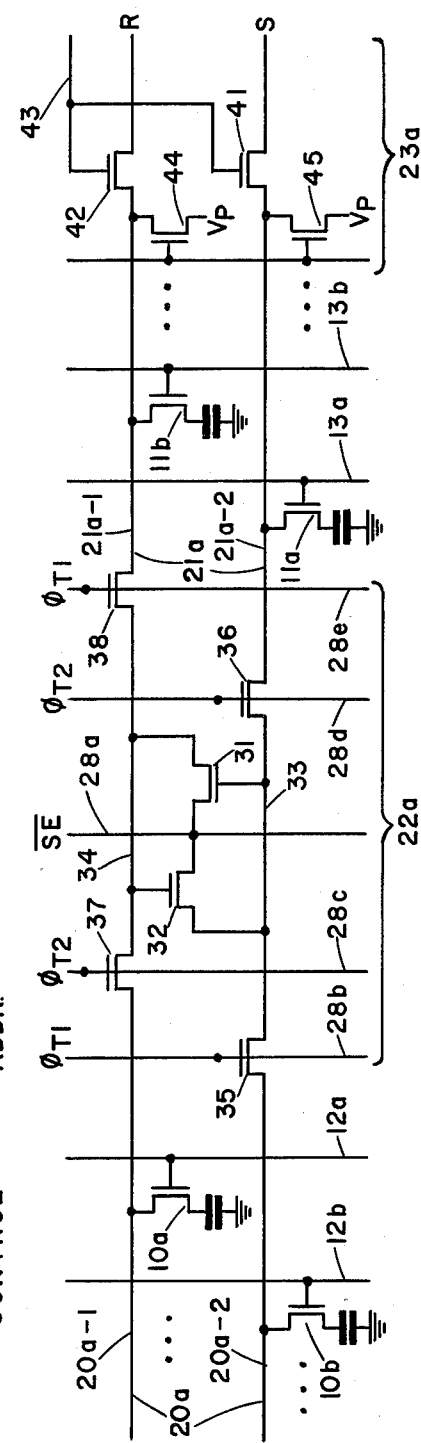
FIG. 2 is a detailed circuit diagram of the storage cells and sense amplifier portion of the memory of FIG. 1.

The interconnections between the cells within arrays 10 and 11, the bit line pairs 20 and 21, and the sense amplifier 22 are illustrated in greater detail in FIG. 2. In this figure, one of the multiple bit line pairs within array 10 is illustrated at 20a; and the corresponding bit line pair within array 11 is indicated at 21a. Individual word lines 12a, 12b, etc. respectively select cells 10a, 10b, etc. These cells alternately connect to the bit lines within bit line pair 20a. Similarly, word lines 13a, 13b, etc., respectively select cells 11a, 11b, etc., within array 11; and these cells alternately connect to the bit lines within bit line pair 21a.

A signal sensing circuit 22a is provided for selectively sensing charge on the bit line pairs 20a and 21a. Circuit 22a includes a pair of cross-coupled MOS transistors 31 and 32. The gate of transistor 31 connects to the source of transistor 32 to form a set node 33; while the gate of transistor 32 connects to the source of transistor 31 to form a reset node 34. Transistors 31 and 32 have drains coupled to a lead 28a within bus 28. A timing signal $\overline{SE}$ is generated on lead 28a by control circuit 27. Basically, signal $\overline{SE}$ is either of a high voltage level or a low voltage level; and the low voltage level enables the flip-flop formed by transistors 31 and 32 to sense the charge from the bit lines. This will be described in greater detail in conjunction with FIGS. 3a and 3b.

Also included in sensing circuit 22a are gating transistors 35–38. In operation, transistors 35 and 36 selectively connect set node 33 to one of the bit lines within bit line pairs 20a and 21a respectively. Similarly, transistors 37 and 38 operate to selectively connect reset node 34 to one of the opposite bit lines within bit line pairs 20a and 21a. The gates of transistors 35–38 are connected respectively to leads 28b–28e. Timing signals $\phi T1$ and $\phi T2$ are applied to these leads to selectively connect the bit lines within pairs 20a and 21a to nodes 33 and 34.

During a read operation, only one of the bit lines within pair 20a and one of the bit lines within pair 21a are gated to nodes 33 and 34. For example, to sense the charge within cell 10a, signal $\phi T2$ goes high to turn on transistors 36 and 37. This connects bit line 20a-1 to node 34 and bit line 21a-2 to set node 33. A high signal is also applied to word line 12a to enable cell 10a to dump its charge onto bit line 20a-1. Similarly, to sense charge stored in cell 10b, signal $\phi T1$ is made high to turn on transistors 35 and 38 and connect node 33 to bit line 20a-2 and node 34 to bit line 21a-1. A high voltage is simultaneously applied to word line 12b to enable cell 10b to dump its charge onto bit line 20a-2.

The above described design substantially improves the signal at nodes 33 and 34 which is produced by charge in the selected cell being dumped onto the corresponding bit line. This is because the signal at nodes 33 and 34 is directly dependent upon the ratio of the cell's storage capacitance and the capacitance of the bit line which is connected to node 33 or 34. And in the disclosed memory, the capacitance of the bit line which connects to node 33 and 34 is approximately one-half that of a conventional memory.

For example, a memory containing 16,000 cells conventionally includes 128 bit lines in each array. A total of 128 sense amplifiers is also included to sense charge on these bit lines. Each sense amplifier has a set node with 64 cells connected thereto via another bit line. In comparison, the disclosed design also includes 128 sense amplifiers; but each sense amplifier has a set node with 32 cells selectively connected thereto from array 10, and 32 other cells selectively connected thereto from array 11, and a reset node with 32 cells connected thereto from array 10, and 32 other cells selectively connected thereto from array 11. During a read operation, only 32 cells connect to the set node and 32 cells connect to the reset node.

Another important aspect of this closed memory architecture is that it brings out both the set node and reset node of the sense amplifiers to one side of array 11. Accordingly, during a write operation, the amplifier formed by transistors 31 and 32 can be set or reset by decoder logic which is positioned alongside only one of the arrays as illustrated in FIG. 1. By comparison, conventional memories having sense amplifiers with a set node connected to bit lines in one array and a reset node connected to bit lines in the other array do not bring out the set and reset nodes to a single side of the array.

Accordingly, these memories require decode logic alongside both of the arrays in order to set the sense amplifiers into predetermined states during a write cycle.

Figure 3A:
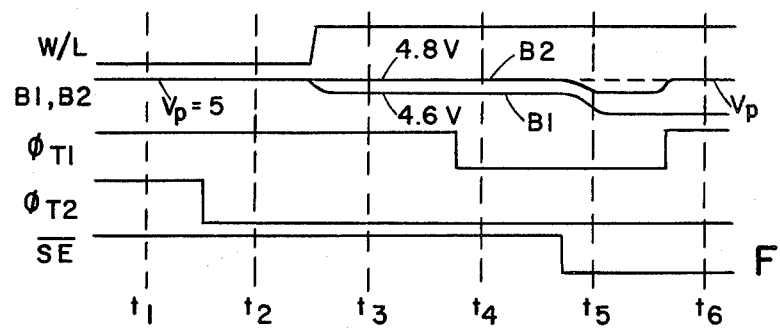
FIGS. 3A and 3B are timing diagrams illustrating the reading and writing of information into the storage cells of FIG. 2.

The operation of reading or sensing of charge from a particular cell within the disclosed memory will now be described in greater detail in conjunction with FIG. 3a. To begin, each of the bit lines within pairs 20a and 21a are precharged to a predetermined voltage. This is performed by simultaneously setting clocking signals $\phi$T1 and $\phi$T2 high to turn on transistors 35–38, and by applying the precharged voltage Vp to each of the bit lines via transistors 44 and 45. This is illustrated at time T1.

Subsequently, either signal $\phi$T1 or $\phi$T2 is forced low. Specifically, $\phi$T1 goes low when cells on bit lines 20a-1 or 21a-2 are to be selected; while $\phi$T2 goes low when cells on bit lines 20a-2 or 21a-1 are to be selected. This is illustrated at time T2. Then, the word line which is connected to the cell that is to be read is set high and simultaneously the word line which is connected to a dummy cell in the opposite array is set high. This is illustrated at time T3. If the selected cell has electrons stored in it, this charge is dumped onto the corresponding bit line which in turn reduces the precharged voltage on that bit line. For example, a precharged voltage of five volts typically is reduced to approximately 4.6 volts. Conversely, if the selected cell has no electrons stored in it, the bit line voltage remains at approximately the precharged voltage.

The dummy cell is constructed to have a capacitance which is less than that of the other cells of the array; and it always is charged prior to a read operation. During a read operation, the charge in the dummy cell that is dumped onto the bit line connected thereto decreases the precharged voltage to a level intermediate between the precharged level and the level generated by dumping charge from a normal cell onto a bit line. This is illustrated in FIG. 3A at time instant T3. Curve B1 represents the voltage on bit line 20a-1 when cell 10a is selected and has electrons stored in it. Curve B2 represents the voltage on bit line 21a-2 when the dummy cell connected thereto is selected.

Subsequently, the one $\phi$T1 or $\phi$T2 timing signal which was high at time T3 is forced low. This is illustrated at T4 in the example where $\phi$T1 is forced low. This isolates nodes 33 and 34 from all four bit lines 20a-1, 20a-2, 21a-1 and 21a-2.

Next, signal $\overline{SE}$ goes low. In response, both transistors 31 and 32 turn on and begin to discharge nodes 34 and 33 respectively. However, the transistor having the higher gate voltage turns on harder; and thus the node 33 or 34 with the lower gate voltage discharges more rapidly. Within a few nanoseconds, the node with the lower voltage drops so low that the transistor 31 or 32 with the lower gate voltage turns off. This discharge is rapid because the large bit line capacitances are not discharged. Then the node 33 or 34 with the higher voltage stops discharging. This is illustrated at time instant T5.

Subsequently, at T6, the bit lines which were ohmically connected to nodes 33 and 34 at time T4 are reconnected to those nodes. This is accomplished of course by raising either $\phi$T1 or $\phi$T2 high. As a result, the bit line that is connected to signal $\overline{SE}$ through a turned-on transistor 33 or 34 discharges. Conversely, the bit line that is connected to signal $\overline{SE}$ through a turned-off transistor cannot discharge. Thus, the charge on that bit line raises the voltage of the node 33 or 34 to which it is ohmically connected to the precharge level.

From the above, it is apparent that the disclosed memory architecture dissipates only approximately half as much energy as does a conventional memory during a read cycle. The energy dissipated by any memory during a read cycle is $\frac{1}{2}cv^2$ where v is the precharge voltage and c is the capacitance of the bit line that is discharged. In the disclosed memory, the bit line that is discharged has only half the number of cells connected to it as compared to a conventional design. Accordingly, its capacitance is also only approximately half the capacitance that is conventionally discharged. Smaller energy dissipation is of course desirable, since it results in less heating and a cooler operating temperature.

Figure 3B:
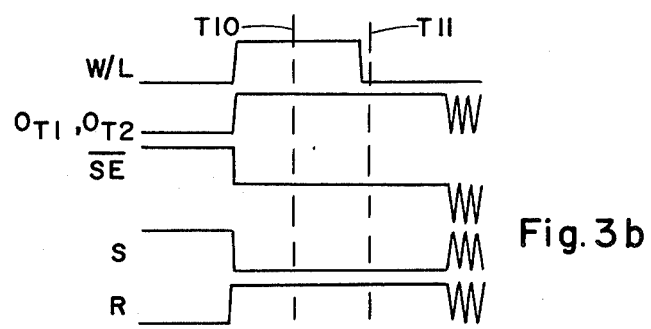

A sequence for writing a particular cell in the disclosed memory is illustrated in FIG. 3B. The cell that is to be written into is selected by setting the signals on its word line high. Simultaneously, signals $\phi$T1 and $\phi$T2 are set high and signal $\overline{SE}$ is set low. In this state, which is illustrated at time T10, the set and reset signals which are applied to transistors 41 and 42 in the decode logic 23 control the state of the sense amplifier. For example, setting the reset signal R high and set signal S low, operates to turn on transistor 32 and turn off transistor 31. Accordingly, bit lines 20a-1 and 21a-1 are both forced high while bit lines 20a-2 and 21a-2 are both forced low. The state of the bit lines is stored in the selected cell by setting its corresponding word line signal low. This is illustrated at time instant T11. Following time instant T11, additional reading and writing sequences may occur.

Figure 4:
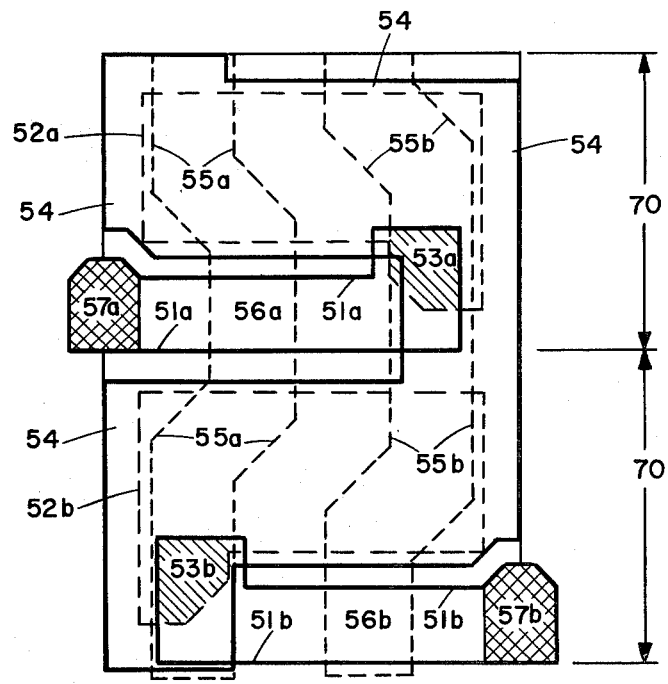
FIG. 4 is a greatly enlarged plane view of the memory cells of FIG. 2.

A preferred physical layout for the cells within arrays 10 and 11 is illustrated in FIG. 4. These cells are formed on a semiconductor substrate which may be either P type or N type. A diffusion 51a in the substrate forms a portion of cell 10a, while a similar diffusion forms a portion of cell 10b. These diffusions are N+ type diffusions when the substrate is P type, for example.

One plate of the storage capacitor of cell 10a is formed by a patterned first layer of polysilicon 52a. The corresponding plate of the storage capacitor within cell 10b is formed by the patterned first layer of polysilicon 52b. A contact between diffusion 51 and layer 52a is indicated by cross hatching at 53a. Similarly, the cross hatching at 53b indicates a contact between diffusions 51b and layer 52b. A patterned second level layer of polysilicon 54 forms the second plate of the storage capacitor for cells 10a and 10b.

A patterned third level layer of polysilicon 55a and 55b respectively forms word lines 12a and 12b. Layer 55a directly overlies diffusion 51a to form a gate of the transistor within cell 10a as indicated at 56a. Similarly, the gate of the transistor within cell 10b is indicated at 56b.

Contact between the bit lines and diffusions 51a and 51b is illustrated generally at 57a and 57b respectively. The bit lines are formed by a patterned layer of metal which lies over the third level layer of patterned polysilicon which forms the word lines. Suitably, the metal comprising the bit lines is aluminum.

Figure 5:
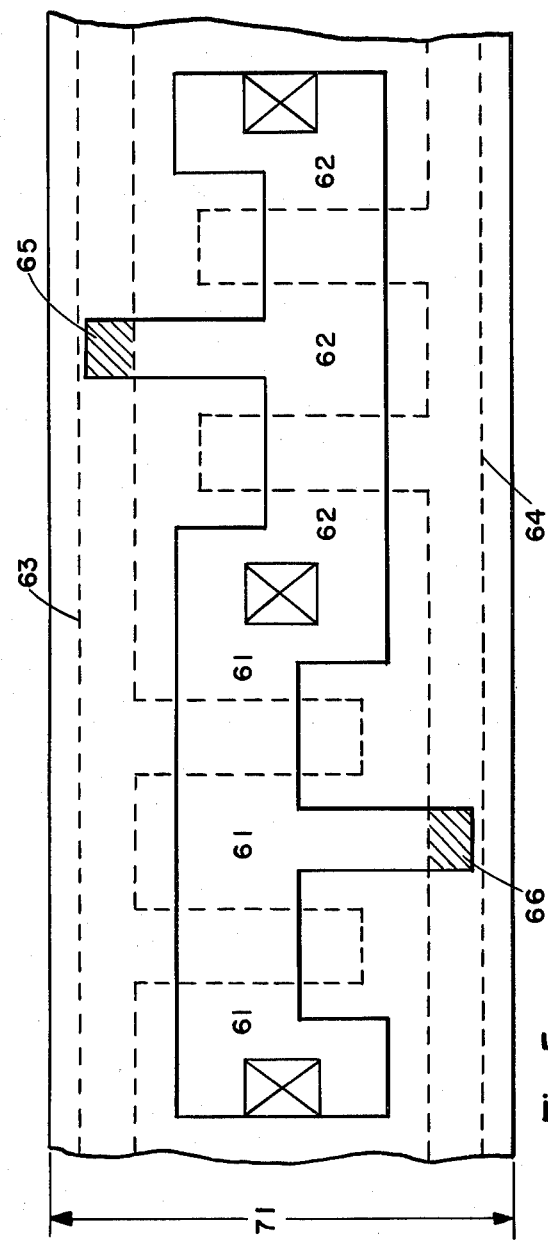
FIG. 5 is a greatly enlarged plane view of the sense amplifier of FIG. 2.

FIG. 5 illustrates the physical layout of the flip-flop within sense amplifier 22a. Included therein is a diffusion having portions 61 and 62. Portion 61 forms the source and drain of transistor 32, while portion 62 forms the source and drain of transistor 31. A patterned layer of polysilicon 63 overlies diffusion 61 to form the gate of transistor 32. Similarly, a patterned layer of polysilicon 64 overlies a portion of diffusion 62 to form the gate of transistor 31. Suitably, the patterned polysilicon layers 63 and 64 are formed from the same third layer of polysilicon which forms the word lines for the memory cells. Contact between layer 63 and diffusion 62, and between layer 64 and diffusion 61 is indicated at 65 and 66 respectively.

An important aspect of the disclosed memory is that it provides essentially twice the amount of space for packaging the sense amplifiers 22 as compared to conventional memories. This is illustrated by comparing the cell layout of FIG. 4 with the sense amplifier layout of FIG. 5. Each cell in FIG. 4 has a pitch dimension 70, while the sense amplifier layout of FIG. 5 has a pitch dimension 71. In conventional designs, pitch dimension 71 must be less than or equal to pitch dimension 70 because one sense amplifier exists for each row of cells. This constraint is in conflict with the requirement, in high density memories, to make the pitch dimension 70 of each of the cells as small as possible. These conflicting requirements are overcome by the disclosed memory, since here pitch dimension 71 need only be less than or equal to two times pitch dimension 70. Accordingly, in the disclosed memory, the sense amplifier's pitch dimension does not limit the size of the memory cells.

Figure 6:
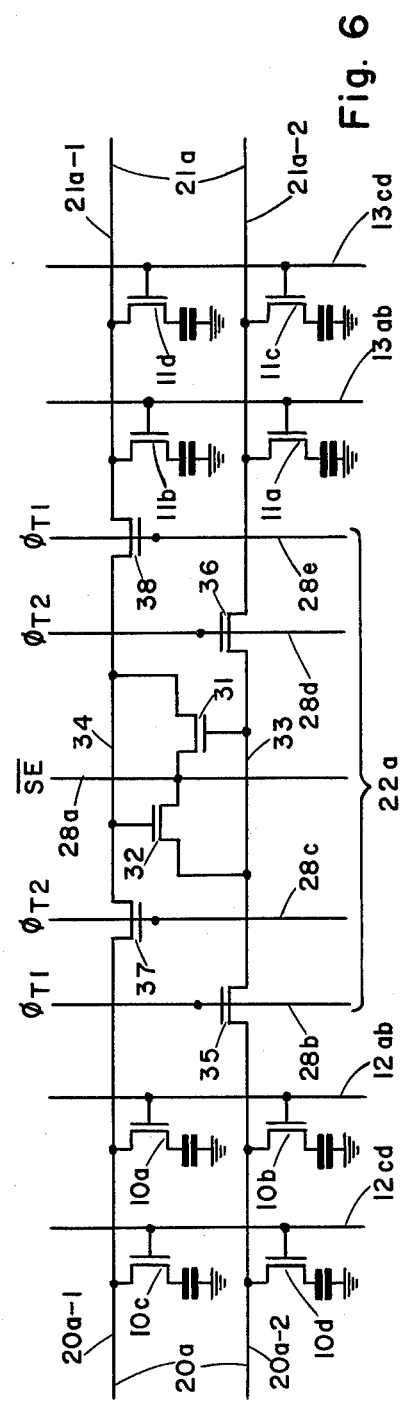
FIG. 6 is a detailed circuit diagram of a second embodiment of the storage cells and sense amplifier portion of the memory of FIG. 1.

An alternative embodiment of the invention is illustrated in FIG. 6. This embodiment is similar to the embodiment of FIG. 2; and like parts are indicated by the same reference numerals. The distinguishing feature of the FIG. 6 embodiment is that the memory cells within bit line pairs 20a and 21a connect in pairs to separate word lines. For example, word line 12ab connects to the pair of cells 10a and 10b. Similarly, word line 12cd connects to the pair of cells 10c and 10d. Accordingly, the number of word lines in the FIG. 6 embodiment is half the number of word lines in the FIG. 2 embodiment.

To read information from one of the cells, such as 10a, the sequence is as follows. Both bit line pairs 20a and 21a are precharged to a predetermined value. Subsequently, a high voltage is applied to word line 12ab. In response thereto, cell 10a distributes any charge which it has in its storage capacitor along bit line 20a-1, while cell 10b distributes charge in its storage capacitor along bit line 20a-2. Timing signal $\phi T2$ is made high to turn on transistors 36 and 37 and sense charge on bit line 20a-1 as was previously described in conjunction with FIG. 3A. Following this read operation, timing signal $\phi T1$ is made high to turn on transistors 35 and 38 and sense charge on bit line 20a-2. By this sensing operation, the charge in memory cell 10b is automatically refreshed. Thus the charge stored therein is at a more well-defined level than it was prior to the reading of cell 10a.

Various embodiments of the invention have now been described in detail. In addition, many changes and modifications can be made to the above described details without departing from the nature and spirit of the invention. Accordingly, it is to be understood that the invention is not limited to said details but is defined by the appended claims.

We claim:

1. A semiconductor memory comprised of:
   a semiconductor substrate;
   a column of N sense amplifiers disposed on said substrate where N is any integer; each of said sense amplifiers consisting of only one pair of transistors that are cross-coupled to form a set node, a reset node, and a sense enable node;
   2N rows of single transistor memory cells disposed on said substrate on one side of said column of sense amplifiers such that each of said sense amplifiers are respectively aligned with first and second rows thereof, plus another 2N rows of single transistor memory cells disposed on said substrate on the opposite side of said column of sense amplifiers such that each of said sense amplifiers are respectively aligned with third and fourth rows thereof;
   2N transistors coupling said first rows to the set node and said third rows to the reset node of the respectively aligned amplifiers in response to one control signal, plus another 2N transistors coupling said second row to the reset node and said fourth row to the set node of the respectively aligned amplifiers in response to another control signal; and
   a decoder disposed on said substrate at one end of said another 2N rows of memory cells for selectively reading data from anyone of said N sense amplifiers and for selectively setting and resetting the sense amplifier to write data into the memory cells connected thereto.

2. A semiconductor memory according to claim 1 and further including a separate word line for each cell in said first, second, third and fourth rows.

3. A semiconductor memory according to claim 1 and further including a separate word line for each pair of cells in said first and second rows, and for each pair of cells in said third and fourth rows.

4. A semiconductor memory according to claim 1, wherein said substrate is P-type.

5. A semiconductor memory according to claim 1, wherein said substrate is N-type.

6. A semiconductor memory according to claim 1, wherein said memory cells each include a storage capacitor comprised of two polysilicon plates.

7. A semiconductor memory according to claim 1, wherein each of said cells have one predetermined pitch and each of said sense amplifiers have another pitch which is less than twice said predetermined pitch.

* * * * *